(12) United States Patent
Takao et al.

(10) Patent No.: US 10,736,220 B2
(45) Date of Patent: Aug. 4, 2020

(54) SUBSTRATE

(71) Applicant: FUJITSU LIMITED, Kawasaki-shi, Kanagawa (JP)

(72) Inventors: Kazuaki Takao, Yokohama (JP); Akira Tamura, Yokohama (JP); Takashi Fukuda, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/702,612

(22) Filed: Dec. 4, 2019

(65) Prior Publication Data
US 2020/0107454 A1 Apr. 2, 2020

Related U.S. Application Data

(62) Division of application No. 16/263,018, filed on Jan. 31, 2019, now Pat. No. 10,531,572.

(30) Foreign Application Priority Data

Feb. 26, 2018 (JP) .................................. 2018-032300

(51) Int. Cl.
*H05K 1/00* (2006.01)
*H05K 3/32* (2006.01)
(Continued)

(52) U.S. Cl.
CPC ....... *H05K 3/326* (2013.01); *H01L 23/49827* (2013.01); *H05K 1/181* (2013.01); *H05K 2201/10378* (2013.01)

(58) Field of Classification Search
CPC ... H05K 1/00; H05K 3/32; H05K 7/20; H01L 23/02; H01L 23/10; H01L 23/40; H01L 23/055; H01L 23/498; H01R 12/00
(Continued)

(56) References Cited

U.S. PATENT DOCUMENTS 4,274,153 A * 6/1981 Kume .................... G04B 33/00
368/220
4,806,195 A * 2/1989 Namysl .................. B29C 43/56
100/269.02
(Continued)

FOREIGN PATENT DOCUMENTS

JP 2005-150750 A 6/2005

OTHER PUBLICATIONS

USPTO (Chen) Notice of Allowance and Notice of Allowability, dated Sep. 12, 2019, in parent U.S. Appl. No. 16/263,018 [pending].
(Continued)

*Primary Examiner* — Xiaoliang Chen
(74) *Attorney, Agent, or Firm* — Fujitsu Patent Center

(57) ABSTRACT

A substrate includes: a wiring substrate; a lower plate disposed below the wiring substrate; a canted coil spring disposed between the lower plate and the wiring substrate; an electronic component package disposed above the wiring substrate; a sheet disposed between the wiring substrate and the electronic component package and including a plurality of connection members that connects a plurality of first electrodes provided on an upper surface of the wiring substrate and a plurality of second electrodes provided on a lower surface of the electronic component package; an upper plate disposed on the electronic component package; and a coupling member that couples the lower plate and the upper plate, wherein the lower plate, the canted coil spring, the wiring substrate, the sheet, the electronic component package, and the upper plate are laminated and fixed in this order by coupling the lower plate and the upper plate by the coupling member.

1 Claim, 8 Drawing Sheets

(51) Int. Cl.
*H05K 7/20* (2006.01)
*H01L 23/02* (2006.01)
*H01L 23/10* (2006.01)
*H01L 23/40* (2006.01)
*H01L 23/055* (2006.01)
*H01L 23/498* (2006.01)
*H01R 12/00* (2006.01)
*H05K 1/18* (2006.01)

(58) Field of Classification Search
USPC ......... 174/260, 258; 438/17, 67, 80; 439/66, 439/77, 91, 733.1; 361/697, 820
See application file for complete search history.

(56) References Cited

U.S. PATENT DOCUMENTS

| | | | | |
|---|---|---|---|---|
| 5,541,622 | A * | 7/1996 | Engle | G05G 9/047 345/161 |
| 5,633,598 | A * | 5/1997 | Van Loan | G01R 1/07328 324/754.08 |
| 5,881,024 | A * | 3/1999 | Nishimura | G04B 19/30 368/227 |
| 5,901,050 | A * | 5/1999 | Imai | H01L 23/055 257/686 |
| 6,168,442 | B1 * | 1/2001 | Naoi | H01R 13/2414 439/66 |
| 2005/0106902 | A1 | 5/2005 | Hougham et al. | |
| 2009/0042323 | A1 * | 2/2009 | Kasukabe | G01R 1/07342 438/17 |
| 2009/0264025 | A1 * | 10/2009 | Hamada | G01R 1/0735 439/733.1 |
| 2010/0029099 | A1 * | 2/2010 | Hamada | G01R 1/0735 439/66 |
| 2010/0053897 | A1 * | 3/2010 | Kusaka | G06F 1/203 361/697 |
| 2010/0105224 | A1 * | 4/2010 | Narita | G01R 31/2889 439/77 |
| 2011/0159444 | A1 * | 6/2011 | Hamada | G01R 3/00 430/315 |

OTHER PUBLICATIONS

USPTO (Chen) Requirement for Restriction/Election, dated Aug. 6, 2019, in parent U.S. Appl. No. 16/263,018 [pending].

\* cited by examiner

SUBSTRATE

CROSS-REFERENCE TO RELATED APPLICATION

This application is a divisional of application Ser. No. 16/263,018, filed Jan. 31, 2019, which is based upon and claims the benefit of priority of the prior Japanese Patent Application No. 2018-32300, filed on Feb. 26, 2018, the entire contents of which are incorporated herein by reference.

FIELD

The embodiments discussed herein are related to a substrate.

BACKGROUND

An interposer for connection is interposed between a wiring substrate and an electronic component package when the electronic component package is mounted on the wiring substrate.

Related art is disclosed in Japanese Laid-Open Patent Publication No. 2005-150750.

SUMMARY

According to an aspect of the embodiments, a substrate includes: a wiring substrate; a lower plate disposed below the wiring substrate; a canted coil spring disposed between the lower plate and the wiring substrate to support the wiring substrate; an electronic component package disposed above the wiring substrate; a sheet disposed between the wiring substrate and the electronic component package and including a plurality of connection members that connects a plurality of first electrodes provided on an upper surface of the wiring substrate and a plurality of second electrodes provided on a lower surface of the electronic component package; an upper plate disposed on the electronic component package; and a coupling member that couples the lower plate and the upper plate, wherein the lower plate, the canted coil spring, the wiring substrate, the sheet, the electronic component package, and the upper plate are laminated and fixed in this order by coupling the lower plate and the upper plate by the coupling member, and the plurality of first electrodes, the plurality of connection members, and the plurality of second electrodes are pressurized and coupled.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

An interposer for connection is interposed between a wiring substrate and an electronic component package when the electronic component package is mounted on the wiring substrate. For example, there is known a structure in which an interposer having a metal member for connecting respective electrodes of a wiring substrate and a module is disposed between the wiring substrate and the module, and a heat sink on the module, the wiring substrate, and a spring under the wiring substrate are fixed by pillars. In this structure, the module, the interposer, and the wiring substrate are pressed against each other by adjusting the spring, and as a result, the electrode of the module and the electrode of the wiring substrate are connected by the metal member of the interposer.

For example, it is conceivable that an interposer having a metal leaf spring is interposed between a wiring substrate and an electronic component package and the electronic component package is pressed against a side of the wiring substrate to connect an electrode of the electronic component package and an electrode of the wiring substrate by the leaf spring. With this arrangement, even in a case where at least one of the wiring substrate and the electronic component package is warped, occurrence of poor connection between the electrode of the wiring substrate and the electrode of the electronic component package may be suppressed by the leaf spring.

However, the leaf spring has a large change in a load of the spring with respect to a displacement amount of the spring. For this reason, there is a case where the electronic component package is pressed against the side of the wiring substrate with a large force. In this case, a large force is applied to the electronic component package and the wiring substrate, which may damage the electronic component package and the wiring substrate.

It is also conceivable that an electrode of a first wiring substrate and an electrode of a second wiring substrate are connected by a leaf spring when the first wiring substrate and the second wiring substrate are connected. In this case as well, the first wiring substrate and the second wiring substrate may be damaged.

For example, a technology to suppress occurrence of damage may be provided.

Hereinafter, embodiments the present invention will be explained with reference to the drawings.

First Embodiment

Figure 1:
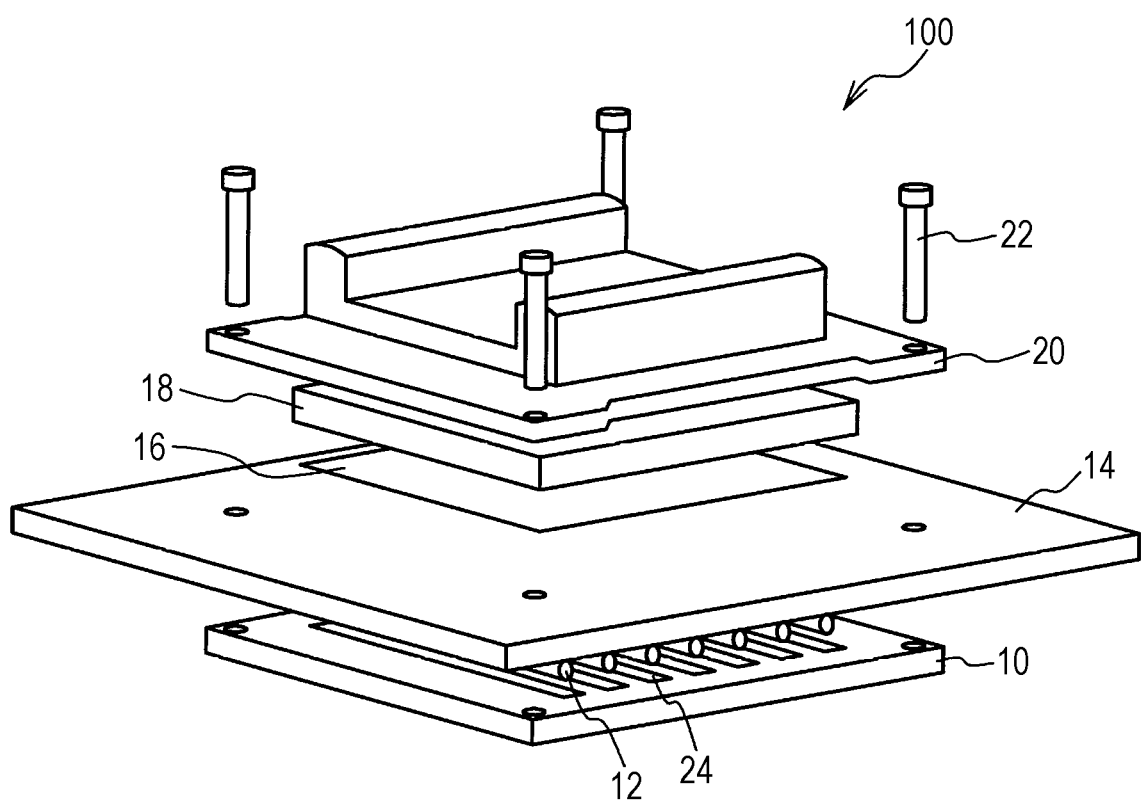
FIG. 1 is an exploded perspective view of a substrate according to a first embodiment.
Figure 2:
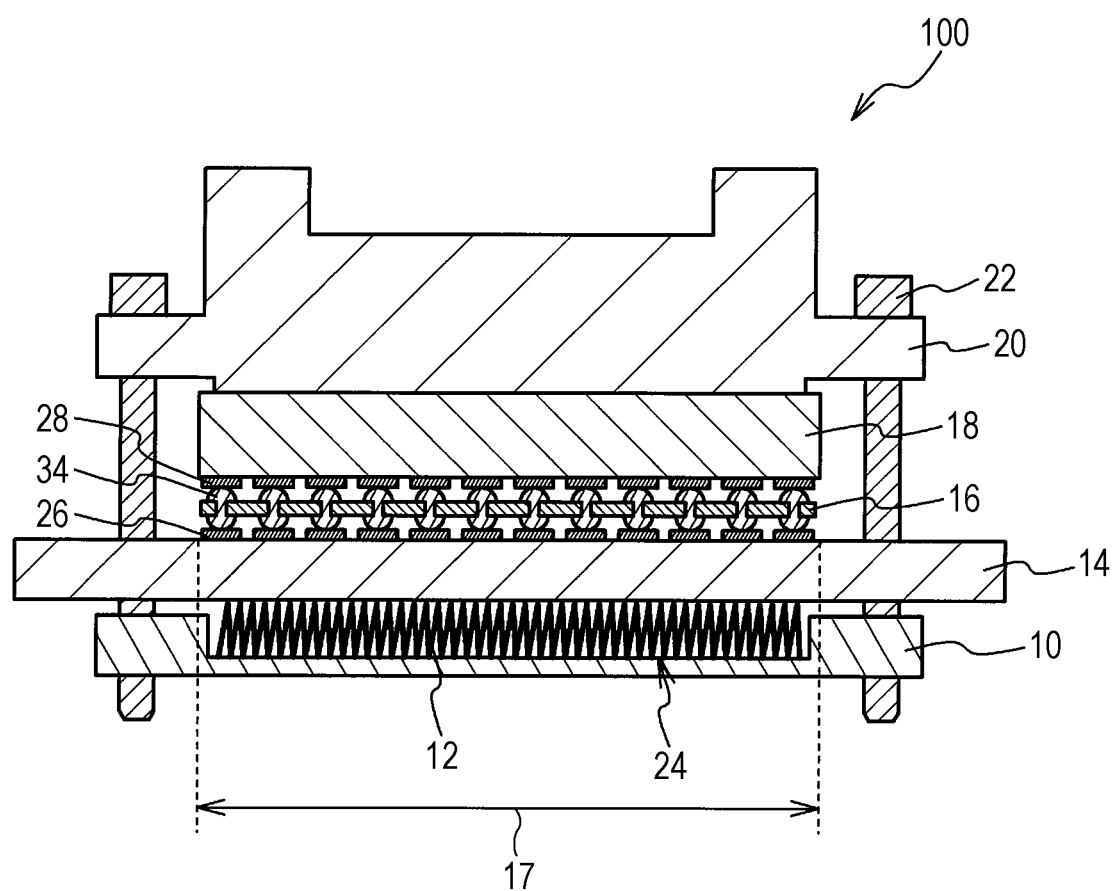
FIG. 2 is a cross sectional view of the substrate according to the first embodiment.

FIG. 1 is an exploded perspective view of a substrate according to a first embodiment. FIG. 2 is a cross-sectional view of the substrate according to the first embodiment. As illustrated in FIGS. 1 and 2, a substrate 100 of the first embodiment includes a lower plate 10, canted coil springs 12, a wiring substrate 14, a sheet 16, an electronic component package (hereinafter referred to as a package) 18, an upper plate 20, and coupling members 22.

The lower plate 10 has a plurality of grooves 24 formed on an upper surface thereof. The plurality of grooves 24 extends linearly in one direction in parallel to each other. The lower plate 10 includes metal such as stainless steel, for example. The canted coil springs 12 are arranged on the upper surface of the lower plate 10 by being fitted into the grooves 24 formed on the upper surface of the lower plate 10. That is, for example, each of the canted coil springs 12 extends linearly in an extending direction of the grooves 24.

Figure 3:
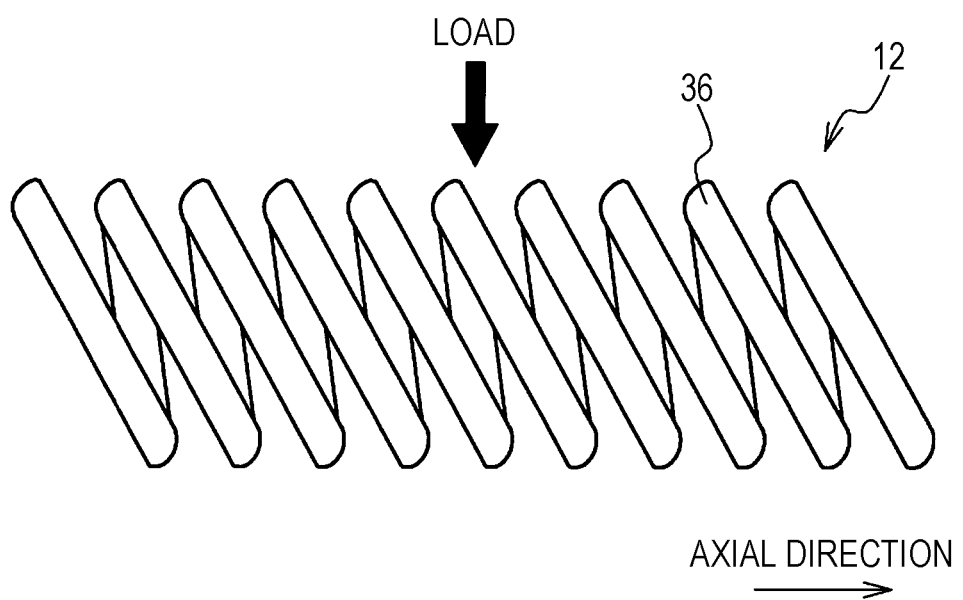
FIG. 3 is a side view enlarging a part of a canted coil spring.

FIG. 3 is a side view enlarging a part of the canted coil spring. As illustrated in FIG. 3, the canted coil spring 12 is a helical spring having a structure in which a wire rod 36 is wound in an inclined manner with respect to a surface perpendicular to an axial direction. The wire rod 36 includes metal such as beryllium copper, for example, but may include an insulating member such as ceramic. The canted coil spring 12 is used so that a load is applied in a direction perpendicular to the axial direction.

As illustrated in FIGS. 1 and 2, the wiring substrate 1.4 is disposed above the lower plate 10 and supported by the canted coil springs 12. That is, for example, the canted coil springs 12 are arranged between the lower plate 10 and the wiring substrate 14, and are in contact with the lower plate 10 and the wiring substrate 14. The wiring substrate 14 is a printed wiring board, for example. A plurality of electrodes 26, each of which is a flat electrode connected to wiring (not illustrated) formed on the wiring substrate 14, is provided on an upper surface of the wiring substrate 14. Each of the electrodes 26 includes metal such as gold or copper, for example.

The package 18 is disposed above the wiring substrate 14. The package 18 is, for example, a land grid array (LGA) package in which a plurality of electrodes 28, each of which is a pad-like flat electrode, is arranged in a lattice shape at high density. The package 18 is, for example, a semiconductor package such as a central processing unit (CPU) package, but another package may be used. The plurality of electrodes 28 provided on a lower surface of the package 18 is electrically connected to the plurality of electrodes 26 provided on the upper surface of the wiring substrate 14, so that the package 18 is mounted on the wiring substrate 14. The canted coil springs 12 are arranged in a mounting region 17 in which the package 18 is mounted on the wiring substrate 14. Each of the canted coil springs 12 extends from one end side to the other end side of the mounting region 17, for example. Each of the electrodes 28 includes metal such as gold or copper, for example. The sheet 16 is disposed between the wiring substrate 14 and the package 18.

Figure 4A:
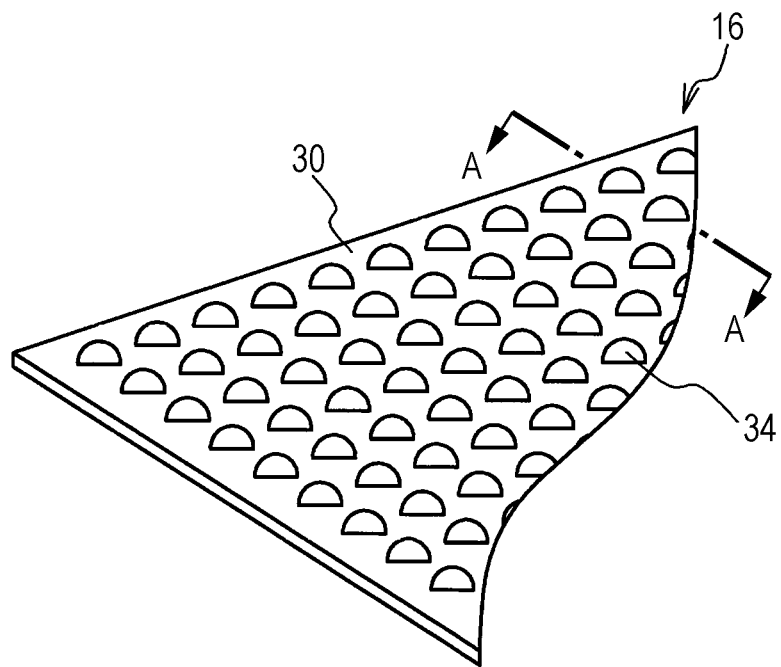
FIG. 4A is a top perspective view illustrating a part of a sheet.
Figure 4B:
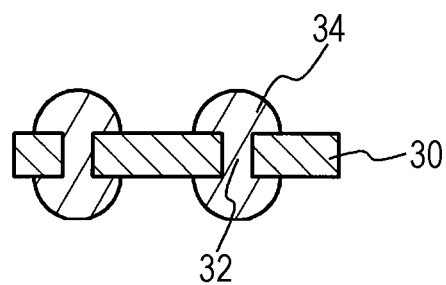
FIG. 4B is a cross-sectional view taken along line A-A of FIG. 4A.

FIG. 4A is a top perspective view illustrating a part of the sheet, and. FIG. 4B is a cross-sectional view taken along line A-A of FIG. 4A. As illustrated in FIGS. 4A and 4B, the sheet 16 includes an insulating sheet 30 provided with a plurality of through holes 32 penetrating from an upper surface to a lower surface of the insulating sheet 30, and a plurality of bumps 34 provided in the plurality of through holes 32 and protruding from the upper surface and the lower surface of the insulating sheet 30. The insulating sheet 30 includes a resin such as polyimide, for example, but may include other insulating members. Each of the bumps 34 is a gold bump, for example, but may be a bump including other materials. The plurality of bumps 34 is arranged in a lattice shape, for example, so as to correspond to the plurality of electrodes 26 of the wiring substrate 14 and the plurality of electrodes 28 of the package 18.

As illustrated in FIGS. 1 and 2, the plurality of electrodes 26 of the wiring substrate 14 and the plurality of electrodes 28 of the package 18 are electrically connected via the bumps 34 provided on the sheet 16 disposed between the wiring substrate 14 and the package 18. The upper plate 20 is disposed on the package 18. The upper plate 20 is in contact with an upper surface of the package 18, for example. The upper plate 20 includes metal having a relatively high thermal conductivity such as aluminum or copper, for example. With this arrangement, the upper plate 20 functions as a heat sink that dissipates heat generated in the package 18.

The coupling members 22 are inserted into holes provided in the upper plate 20, the wiring substrate 14, and the lower plate 10 to couple the lower plate 10 and the upper plate 20. Each of the coupling members 22 is a screw, for example, but another member may be used as long as the member is capable of coupling the lower plate 10 and the upper plate 20. The lower plate 10 and the upper plate 20 have a rectangular shape when viewed from a top, and are coupled by the coupling members 22 at respective four corner portions, for example. Since both the lower plate 10 and the upper plate 20 include metal, the lower plate 10 and the upper plate 20 may be firmly coupled by the coupling members 22. Since the coupling members 22 pass through the holes of the wiring substrate 14 to couple the lower plate 10 and the upper plate 20, displacement of the wiring substrate 14 may be suppressed.

Since the lower plate 10 and the upper plate 20 are coupled by the coupling members 22, the canted coil springs 12, the wiring substrate 14, the sheet 16, and the package 18 are laminated and fixed in this order from a side of the lower plate 10 between the lower plate 10 and the upper plate 20. Since the lower plate 10 and the upper plate 20 are coupled by the coupling members 22, the electrodes 26 of the wiring substrate 14, the bumps 34 of the sheet 16, and the electrodes 28 of the package 18 are pressurized to connect the wiring substrate 14 and the package 18. That is, for example, the electrodes 26, the bumps 34, and the electrodes 28 are merely in contact with each other by pressurization, and are not joined by solder or the like.

Figure 5:
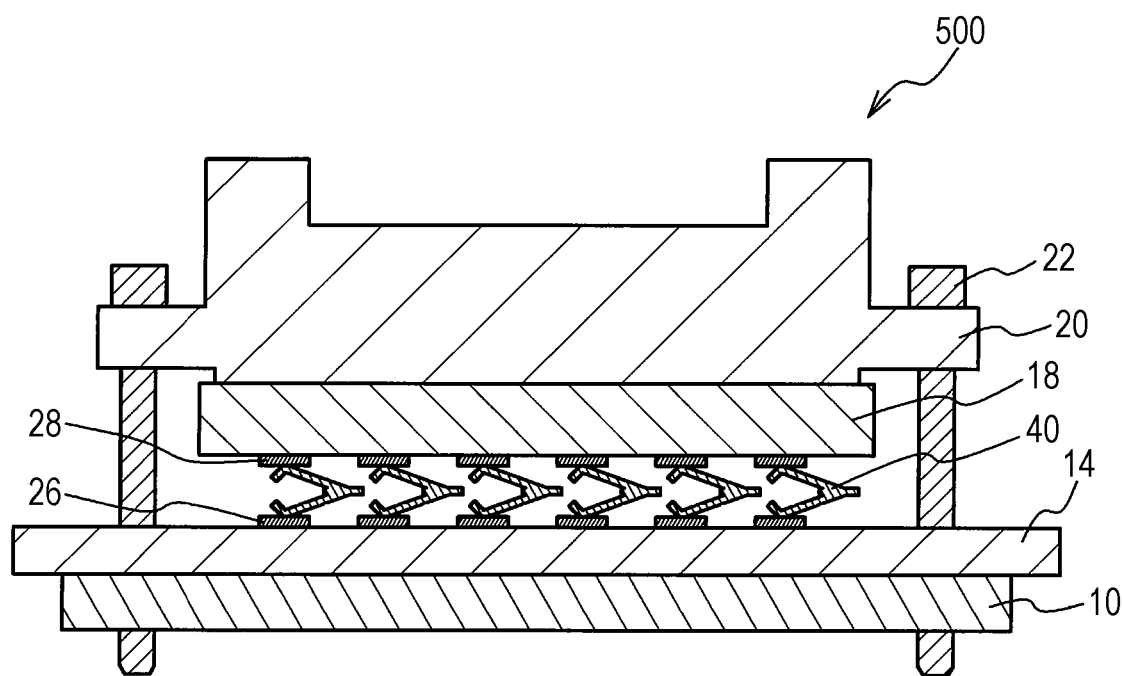
FIG. 5 is a cross-sectional view of a substrate according to a comparative example.

FIG. 5 is a cross-sectional view of a substrate according to a comparative example. As illustrated in FIG. 5, in a substrate 500 of the comparative example, a canted coil spring 12 is not disposed between a lower plate 10 and a wiring substrate 14, and the lower plate 10 and the wiring substrate 14 are in contact with each other. A plurality of electrodes 26 of the wiring substrate 14 and a plurality of electrodes 28 of a package 18 are electrically connected by a plurality of metal leaf springs 40. Since other configurations are the same as those in FIG. 2 of the first embodiment, explanation thereof is omitted.

In Comparative Example 1, the plurality of electrodes 26 of the wiring substrate 14 and the plurality of electrodes 28 of the package 18 are electrically connected by the plurality of leaf springs 40. With this arrangement, for example, temperature rise in the wiring substrate 14 and the package 18 may be suppressed as compared with a case where the electrodes 26 of the wiring substrate 14 and the electrodes 28 of the package 18 are joined by solder. Therefore, occurrence of large warpage in the wiring substrate 14 and the package 18 is suppressed. For example, even in a case where at least one of the wiring substrate 14 and the package 18 is warped when the package 18 is mounted on the wiring substrate 14, the warpage of the wiring substrate 14 and the package 18 may be absorbed by the leaf springs 40. Therefore, it is possible to suppress occurrence of poor connection between the plurality of electrodes 26 of the wiring substrate 14 and the plurality of electrodes 28 of the package 18.

Figure 6:
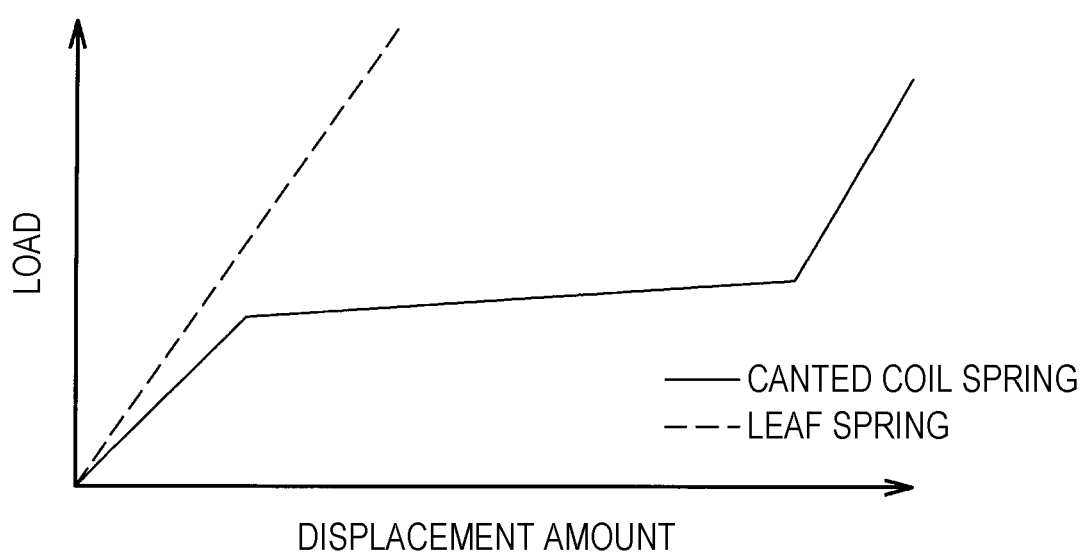
FIG. 6 is a diagram for explaining a relationship between a displacement amount and a load of a spring.

However, each of the leaf springs 40 has a property that a load of the spring changes greatly with respect to a displacement amount of the spring. FIG. 6 is a diagram for explaining a relationship between the displacement amount and the load of the spring. A horizontal axis in FIG. 6 represents the displacement amount of the spring. A vertical axis in FIG. 6 represents the load of the spring. In FIG. 6, a characteristic of the leaf spring is indicated by a broken line, and a characteristic of a canted coil spring is indicated by a solid line. As illustrated in FIG. 6, the leaf spring has a property that the load of the spring changes greatly with respect to the displacement amount of the spring. That is, for example, in the leaf spring, a large force is applied in order to increase the displacement amount.

After the package 18 is mounted on the wiring substrate 14, warpage may occur in the wiring substrate 14 and the package 18 by heat generation of the package 18, changes in characteristics due to aging of materials of the package 18 and the wiring substrate 14, and the like. Even in such a case, it is preferable that the displacement amount of the leaf spring 40 is increased in advance so that the electrodes 26 of the wiring substrate 14 and the electrodes 28 of the package 18 are kept connected by the leaf springs 40. This will be explained with reference to FIGS. 7A and 7B.

Figure 7A:
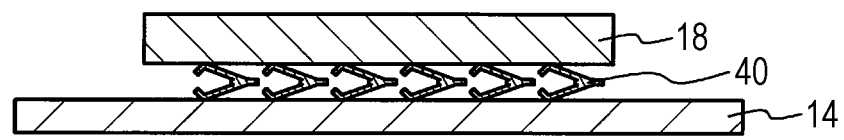
FIGS. 7A and 7B are diagrams for explaining an effect of leaf springs in the comparative example.
Figure 7B:
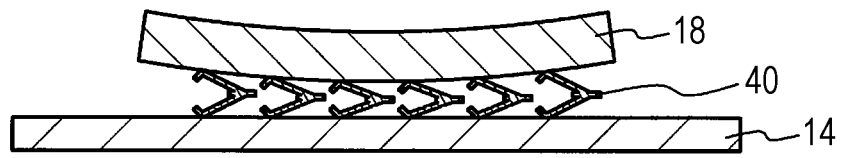

FIGS. 7A and 7B are diagrams for explaining an effect of the leaf springs in the comparative example. FIG. 7A is a diagram illustrating a state where the wiring substrate 14 and the package 18 are not warped. FIG. 7B is a diagram illustrating a state where the package 18 is warped. FIGS. 7A and 7B illustrate only the wiring substrate 14, the package 18, and the leaf springs 40 for clarity of the drawing. As illustrated in FIGS. 7A and 7B, even in the case where the package 18 is warped, occurrence of poor connection between the wiring substrate 14 and the package 18 may be suppressed by deformation of the leaf springs 40.

In this way, even in the case where the package 18 is warped after being mounted on the wiring substrate 14, it is preferable that the leaf springs 40 are largely displaced in advance in order to suppress the occurrence of poor connection between the wiring substrate 14 and the package 18. As illustrated in FIG. 6, the leaf spring 40 has a large change in the load with respect to the displacement amount. Since a large number of the electrodes 28 of the package 18 are provided at high density, a large number of the leaf springs 40 are also provided. For this reason, in FIG. 5, in order to increase the displacement amounts of the plurality of leaf springs 40, an upper plate 20 is pressed against a side of the lower plate 10 with a large force by the coupling members 22. With this arrangement, a large force is applied to the wiring substrate 14 and the package 18, and at least one of the wiring substrate 14 and the package 18 may be damaged.

On the other hand, as illustrated in FIG. 6, the canted coil spring has a property that the load becomes substantially constant with respect to the displacement amount in a certain range in a direction perpendicular to an axial direction. Therefore, in the first embodiment, even in a case where the canted coil springs 12 are largely displaced to some extent in the direction perpendicular to the axial direction, a force applied to the canted coil springs 12 does not increase so much.

Figure 8A:
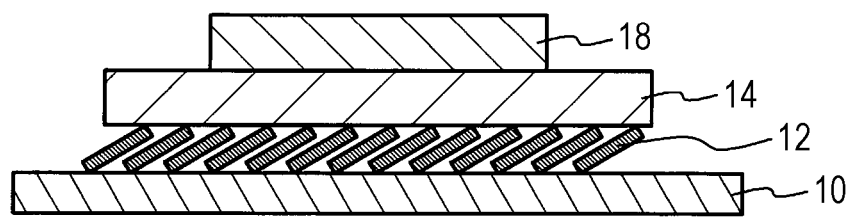
FIGS. 8A to 8C are diagrams for explaining an effect in the first embodiment.
Figure 8B:
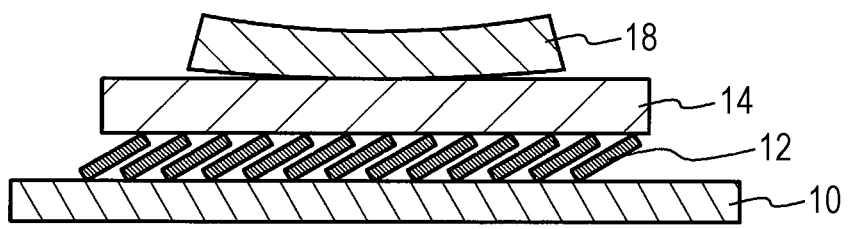
Figure 8C:
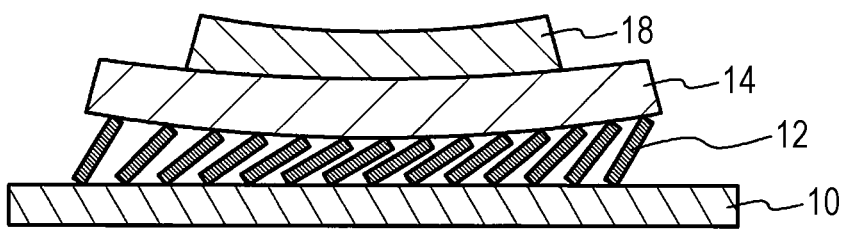

FIGS. 8A to 8C are diagrams for explaining an effect in the first embodiment. FIG. 8A is a diagram illustrating a state where the wiring substrate 14 and the package 18 are not warped. FIG. 8B is a diagram illustrating a state where the package 18 is warped. FIG. 8C is a diagram illustrating a state where the wiring substrate 14 follows the warpage of the package 18 by the canted coil springs 12. FIGS. 8A and 8C illustrate only the lower plate 10, the canted coil springs 12, the wiring substrate 14, and the package 18 for clarity of the drawing.

As illustrated in FIGS. 8A to 8C, even in the case where the package 18 is warped after being mounted on the wiring substrate 14, the displacement amounts of the canted coil springs 12 partially change, and the wiring substrate 14 follows the warpage of the package 18. In this way, even in the case where the package 18 is warped, occurrence of poor connection between the wiring substrate 14 and the package 18 may be suppressed by the partial change in the displacement amounts of the canted coil springs 12. Even in a case where the wiring substrate 14 is warped, the occurrence of poor connection between the wiring substrate 14 and the package 18 is suppressed by a similar mechanism.

According to the first embodiment, as illustrated in FIG. 2, the canted coil springs 12 are arranged between the lower plate 10 disposed below the wiring substrate 14 and the wiring substrate 14, to support the wiring substrate 14. The plurality of electrodes 26 of the wiring substrate 14 is connected to the plurality of electrodes 28 of the package 18 via the plurality of bumps 34 of the sheet 16 disposed between the wiring substrate 14 and the package 18. Since the upper plate 20 disposed on the package 18 and the lower plate 10 are coupled by the coupling members 22, the lower plate 10, the canted coil springs 12, the wiring substrate 14, the sheet 16, the package 18, and the upper plate 20 are laminated and fixed in this order. Since the upper plate 20 and the lower plate 10 are coupled by the coupling members 22, the plurality of electrodes 26 of the wiring substrate 14, the plurality of bumps 34 of the sheet 16, and the plurality of electrodes 28 of the package 18 are pressurized and connected.

As illustrated in FIG. 6, each of the canted coil springs 12 has a property that the load becomes substantially constant with respect to the displacement amount in a certain range. Therefore, the displacement amounts of the canted coil springs 12 may be increased to some extent even if the upper plate 20 is not pressed against the side of the lower plate 10 with a very large force by the coupling members 22. As a result, application of a large force to the wiring substrate 14 and the package 18 is suppressed, and occurrence of damage in the wiring substrate 14 and the package 18 may be suppressed. As illustrated in FIGS. 8A to 8C, even in the case where at least one of the wiring substrate 14 and the package 18 is warped, occurrence of poor connection between the plurality of electrodes 26 of the wiring substrate 14 and the plurality of electrodes 28 of the package 18 may be suppressed.

In the comparative example, since the electrodes 26 of the wiring substrate 14 and the electrodes 28 of the package 18 are electrically connected via the leaf springs 40, a signal transmission path may become long and characteristics may be deteriorated, for example. On the other hand, in the first embodiment, the electrodes 26 of the wiring substrate 14 and the electrodes 28 of the package 18 are electrically connected by the bumps 34 provided in the through holes 32 of the insulating sheet 30 and protruding from the upper surface and the lower surface of the insulating sheet 30. With this arrangement, a signal transmission path may be shortened, and deterioration of characteristics (for example, deterioration of a high-speed transmission characteristic) may be suppressed.

As illustrated in FIG. 2, each of the canted coil springs 12 is provided to extend from one end side to the other end side opposite to the one end side of the mounting region 17 in which the package 18 is mounted on the wiring substrate 14. In the comparative example, a large number of the leaf springs 40 are required since the leaf springs 40 are arranged for each of the electrodes 26 and 28. However, in the first embodiment, it is sufficient to arrange one canted coil spring 12 for the plurality of electrodes 26 and the plurality of electrodes 28. Therefore, it is possible to reduce the number of parts and simplify an assembling process, and accordingly to reduce a cost. In the comparative example, the leaf springs 40 are arranged for each of the electrodes 26 and the electrodes 28. Therefore, the leaf springs 40 are desirably miniaturized in accordance with increase in density of the electrode 26 and the electrode 28, and spring properties of the leaf springs 40 deteriorate. On the other hand, in the first embodiment, each of the canted coil springs 12 is provided to extend from one end side to the other end side of the mounting region 17. Therefore, the canted coil springs 12 are free from restriction due to the increase in the density of the electrode 26 and the electrode 28. The canted coil springs 12 may extend to the outside of the mounting region 17 from a viewpoint of suppressing poor connection between the plurality of electrodes 26 of the wiring substrate 14 and the plurality of electrodes 28 of the package 18.

As illustrated in FIGS. 1 and 2, the canted coil springs 12 are arranged on the lower plate 10 by being fitted into the groove 24 provided on the upper surface of the lower plate 10. With this arrangement, movement of positions of the canted coil springs 12 are suppressed, and forces of the canted coil springs 12 are effectively transmitted to the wiring substrate 14. A depth of the groove 24 is such a depth as to allow each of the canted coil springs 12 projects from the groove 24 even in a case where the canted coil springs 12 are sufficiently displaced in order to suppress poor connection between the electrodes 26 of the wiring substrate 14 and the electrodes 28 of the package 18.

As illustrated in FIG. 1, a plurality of the canted coil springs 12 is arranged on the lower plate 10. With this arrangement, even in the case where at least one of the wiring substrate 14 and the package 18 is warped, occurrence of poor connection between the electrodes 26 of the wiring substrate 14 and the electrodes 28 of the package 18 may be suppressed.

In the first embodiment, the case is exemplified where the bumps 34 are used as a connection member provided on the sheet 16 and electrically connecting the electrodes 26 of the wiring substrate 14 and the electrodes 28 of the package 18, but the present invention is not limited to this case. Another connection member such as a flat electrode may be used, for example, as long as it is possible to electrically connect the electrodes 26 of the wiring substrate 14 and the electrodes 28 of the package 18. However, from a viewpoint of electrically connecting the electrodes 26 of the wiring substrate 14 and the electrodes 28 of the package 18 with a smaller force, the connection member provided on the sheet 16 are preferably the bumps.

Second Embodiment

Figure 9:
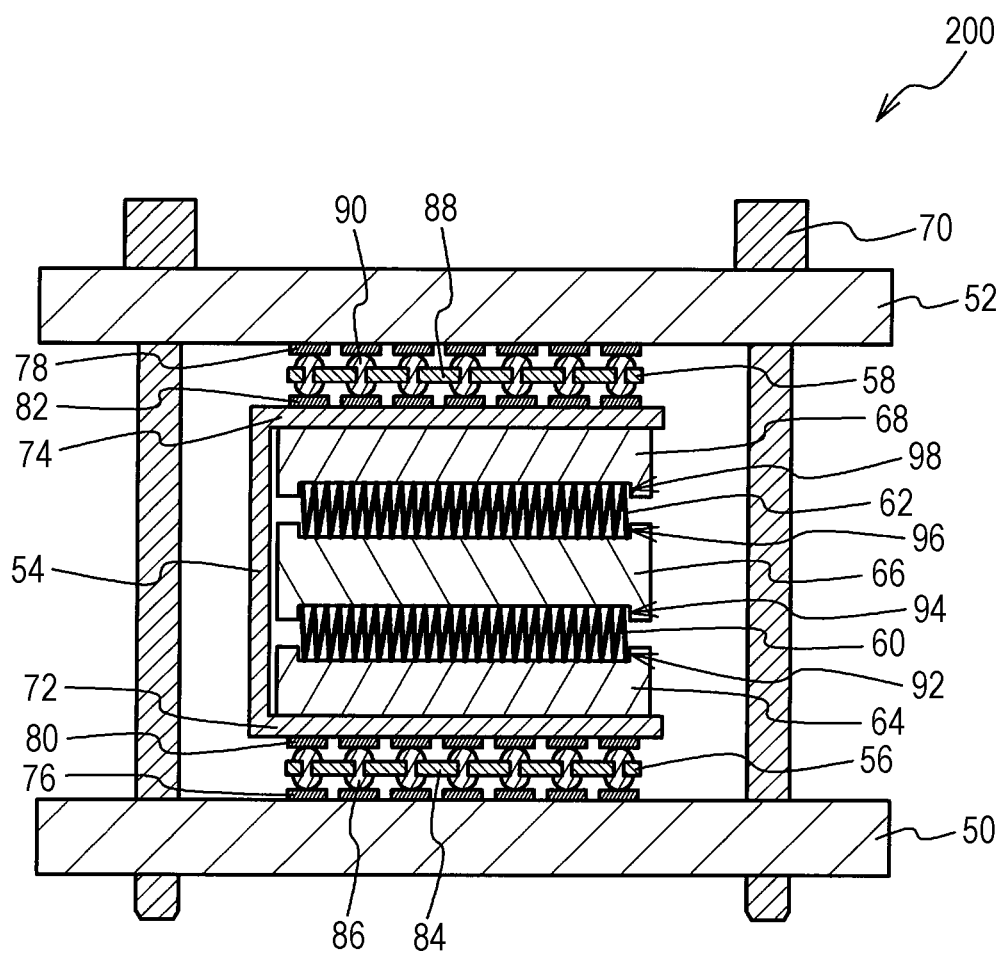
FIG. 9 is a cross-sectional view of a substrate according to a second embodiment.

FIG. 9 is a cross-sectional view of a substrate according to a second embodiment. As illustrated in FIG. 9, a substrate 200 of the second embodiment includes a wiring substrate 50, a wiring substrate 52, a flexible substrate 54, a sheet 56, a sheet 58, a canted coil spring 60, a canted coil spring 62, a member 64, a member 56, a member 68, and coupling members 70. The wiring substrates 50 and 52 are printed wiring boards, for example.

The flexible substrate 54 is bent and disposed between the wiring substrate 50 and the wiring substrate 52. The flexible substrate 54 has a region 72 opposed to the wiring substrate 50 and a region 74 opposed to the wiring substrate 52. In the flexible substrate 54, a plurality of electrodes 80 is provided in the region 72 opposed to the wiring substrate 50, and a plurality of electrodes 82 is provided in the region 74 opposed to the wiring substrate 52. The plurality of electrodes 80 and the plurality of electrodes 82 are electrically connected by a wiring (not illustrated) formed on the flexible substrate 54. The electrodes 80 and 82 include metal such as gold or copper, for example.

The sheet 56 is disposed between the wiring substrate 50 and the region 72 of the flexible substrate 54. The sheet 56 includes an insulating sheet 84 and bumps 86 penetrating the insulating sheet 84 and protruding from an upper surface and a lower surface of the insulating sheet 84, similarly to the sheet 16 of the first embodiment. The insulating sheet 84 includes a resin such as polyimide, for example. Each of the bumps 86 is a gold bump, for example. The plurality of electrodes 76 provided on the wiring substrate 50 is electrically connected to the plurality of electrodes 80 of the flexible substrate 54 via the plurality of bumps 86 of the sheet 56.

The sheet 58 is disposed between the wiring substrate 52 and the region 74 of the flexible substrate 54. The sheet 58 includes an insulating sheet 88 and bumps 90 penetrating the insulating sheet 88 and protruding from an upper surface and a lower surface of the insulating sheet 88, similarly to the sheet 16 of the first embodiment. The insulating sheet 88 includes a resin such as polyimide, for examples Each of the bumps 90 is a gold bump, for example. The plurality of electrodes 78 provided on the wiring substrate 52 is electrically connected to the plurality of electrodes 82 of the flexible substrate 54 via the plurality of bumps 90 of the sheet 58.

In this manner, the wiring substrate 50 and the wiring substrate 52 are electrically connected via the flexible substrate 54.

The canted coil springs 60 and 62 and the members 64 to 68 are disposed between the regions 72 and 74 of the flexible substrate 54. Each of the canted coil springs 60 and 62 are the same as each of the canted coil springs 12 of the first embodiment. As in the case of the first embodiment, each of the canted coil springs 60 and 62 may be provided in plural numbers. The members 64 to 68 are metal members such as stainless steel, for example, but may be insulating members such as resins. The canted coil spring 60 is fitted into a groove 92 formed on the member 64 and a groove 94 formed on the member 66. The canted coil spring 62 is fitted into a groove 96 formed on the member 66 and a groove 98 formed on the member 68.

The coupling members 70 are inserted into holes provided in the wiring substrate 50 and the wiring substrate 52 to couple the wiring substrate 50 and the wiring substrate 52. Each of the coupling members 70 is a screw, for example. Since the wiring substrate 50 and the wiring substrate 52 are coupled by the coupling members 70, the sheet 56, the region 72 of the flexible substrate 54, the member 64, the canted coil spring 60, the member 66, the canted coil spring 62, the member 68, the region 74 of the flexible substrate 54, and the sheet 58 are laminated and fixed in this order from a side of the wiring substrate 50 between the wiring substrate 50 and the wiring substrate 52. Since the wiring substrate 50 and the wiring substrate 52 are coupled by the coupling members 70, the electrodes 76 of the wiring substrate 50, the bumps 86 of the sheet 56, and the electrodes 80 of the flexible substrate 54 are pressurized to connect the wiring substrate 50 and the flexible substrate 54. Similarly, since the wiring substrate 50 and the wiring substrate 52 are coupled by the coupling members 70, the electrodes 78 of the wiring substrate 52, the bumps 90 of the sheet 58, and the electrodes 82 of the flexible substrate 54 are pressurized to connect the wiring substrate 52 and the flexible substrate 54.

According to the second embodiment, the flexible substrate 54 is bent and disposed between the wiring substrate 50 and the wiring substrate 52. The plurality of electrodes 76 of the wiring substrate 50 is connected to the plurality of electrodes 80 of the flexible substrate 54 via the bumps 86 of the sheet 56 disposed between the wiring substrate 50 and the region 72 of the flexible substrate 54. The plurality of electrodes 78 of the wiring substrate 52 is connected to the plurality of electrodes 82 of the flexible substrate 54 via the bumps 90 of the sheet 58 disposed between the wiring substrate 52 and the region 74 of the flexible substrate 54. Between the region 72 and the region 74 of the flexible substrate 54, the member 64, the canted coil spring 60, the member 66, the canted coil spring 62, and the member 68 are arranged in this order from a side of the region 72. Since the wiring substrate 50 and the wiring substrate 52 are coupled by the coupling members 70, the wiring substrate 50, the sheet 56, the region 72 of the flexible substrate 54, the member 64, the canted coil spring 60, the member 66, the canted coil spring 62, the member 68, the region 74 of the flexible substrate 54, the sheet 58, and the wiring substrate 52 are laminated and fixed in this order. Since the wiring substrate 50 and the wiring substrate 52 are coupled by the coupling members 70, the electrodes 76 of the wiring substrate 50, the bumps 86 of the sheet 56, and the electrodes 80 of the flexible substrate 54 are pressurized and connected, and the electrodes 78 of the wiring substrate 52, the bumps 90 of the sheet 58, and the electrodes 82 of the flexible substrate 54 are pressurized and connected.

Even in such a case, as in the case of the first embodiment, displacement amounts of the canted coil springs 60 and 62 may be increased to some extent even if the wiring substrate 52 is not pressed against a side of the wiring substrate 50 with a very large force by the coupling members 70. As a result, application of a large force to the wiring substrate 50 and the wiring substrate 52 is suppressed, and occurrence of damage in the wiring substrate 50 and the wiring substrate 52 may be suppressed. Even in a case where at least one of the wiring substrate 50 and the wiring substrate 52 is warped, it is possible to make the flexible substrate 54 follow the warpage of the wiring substrate 50 and the wiring substrate 52 by the canted coil springs 60 and 62. Therefore, it is possible to suppress occurrence of poor connection between the wiring substrate 50 and the wiring substrate 52 and the flexible substrate 54.

Although the embodiments of the present invention have been described in detail above, the present invention is not limited to such specific embodiments, and various modifications and changes may be made without departing from a sprit and a scope of the present invention described in the claims.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A substrate comprising:
 a first wiring substrate including a plurality of first electrodes;
 a second wiring substrate including a plurality of second electrodes;
 a flexible substrate bent and disposed between the first wiring substrate and the second wiring substrate and including a plurality of third electrodes provided in a first region opposed to the first wiring substrate and a plurality of fourth electrodes provided in a second region opposed to the second wiring substrate;
 a first sheet disposed between the first wiring substrate and the first region of the flexible substrate and including a plurality of first connection members that couples the plurality of first electrodes and the plurality of third electrodes;
 a second sheet disposed between the second wiring substrate and the second region of the flexible substrate and including a plurality of second connection members that couples the plurality of second electrodes and the plurality of fourth electrodes;
 a first member, a first canted coil spring, a second member, a second canted coil spring, and a third member disposed in this order from a side of the first region between the first region and the second region of the flexible substrate; and
 a coupling member that couples the first wiring substrate and the second wiring substrate,
 wherein the first wiring substrate, the first sheet, the first region of the flexible substrate, the first member, the first canted coil spring, the second member, the second canted coil spring, the third member, the second region of the flexible substrate, the second sheet, and the second wiring substrate are laminated and fixed in this order by coupling the lower plate and the upper plate by the coupling member, the plurality of first electrodes, the plurality of first connection members, and the plurality of third electrodes are pressurized and coupled, and the plurality of second electrodes, the plurality of second connection members, and the plurality of fourth electrodes are pressurized and coupled.

* * * * *